United States Patent
Jin et al.

(10) Patent No.: US 9,093,977 B2
(45) Date of Patent: Jul. 28, 2015

(54) INTEGRATED PASSIVE DEVICE FILTER WITH FULLY ON-CHIP ESD PROTECTION

(75) Inventors: Jun-De Jin, Hsinchu (TW); Ming Hsien Tsai, New Taipei (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 143 days.

(21) Appl. No.: 13/562,571

(22) Filed: Jul. 31, 2012

(65) Prior Publication Data

US 2014/0036396 A1 Feb. 6, 2014

(51) Int. Cl.
| | | |
|---|---|---|
| H02H 9/00 | (2006.01) | |
| H03H 7/40 | (2006.01) | |
| H02H 9/04 | (2006.01) | |
| H01L 23/60 | (2006.01) | |
| H01L 23/64 | (2006.01) | |
| H01L 23/522 | (2006.01) | |

(52) U.S. Cl.
CPC .............. *H03H 7/40* (2013.01); *H01L 23/60* (2013.01); *H01L 23/64* (2013.01); *H02H 9/04* (2013.01); *H02H 9/046* (2013.01); *H01L 23/5223* (2013.01); *H01L 23/5227* (2013.01); *Y10T 29/49117* (2015.01)

(58) Field of Classification Search
CPC ......................................................... H02H 9/046
USPC ............................................................. 361/56
See application file for complete search history.

(56) References Cited

U.S. PATENT DOCUMENTS

| | | | | |
|---|---|---|---|---|
| 3,695,855 | A * | 10/1972 | Ainslie et al. ................. | 428/610 |
| 7,170,384 | B2 * | 1/2007 | Kim et al. ..................... | 336/200 |
| 7,418,251 | B2 * | 8/2008 | Liu ............................... | 455/333 |
| 7,428,258 | B2 * | 9/2008 | Fullerton et al. .............. | 375/130 |
| 7,907,924 | B2 * | 3/2011 | Kawasaki ................. | 455/252.1 |
| 8,054,597 | B2 * | 11/2011 | Gebreselasie et al. .......... | 361/56 |
| 8,482,889 | B2 * | 7/2013 | Huang et al. .................... | 361/56 |
| 8,504,952 | B2 * | 8/2013 | Yehezkely ..................... | 716/100 |
| 8,592,865 | B1 * | 11/2013 | Hughes ........................ | 257/192 |
| 2002/0030261 | A1 * | 3/2002 | Rolda et al. .................. | 257/685 |
| 2010/0027173 | A1 * | 2/2010 | Wijmeersch .................... | 361/56 |

* cited by examiner

*Primary Examiner* — Thienvu Tran
*Assistant Examiner* — Tien Mai
(74) *Attorney, Agent, or Firm* — Eschweiler & Associates, LLC

(57) ABSTRACT

The present disclosure relates to an on-chip electrostatic discharge (ESD) protection circuit that may be reused for a variety of integrated circuit (IC) applications. Both inductor-capacitor (LC) parallel resonator and shunt inductor (connected to ground) are used as ESD protection circuits and also as a part of an impedance matching network for a given IC application. The ESD LC resonator can be designed with a variety of band pass filter (BPF) topologies. On-chip ESD protection circuit allows for co-optimization ESD and BPF performance simultaneously, a fully on-chip ESD solution for integrated passive device (IPD) processes, eliminates a need for active ESD device protection, additional processes to support off-chip ESD protection, reduces power consumption, and creates a reusable BPF topology.

16 Claims, 9 Drawing Sheets

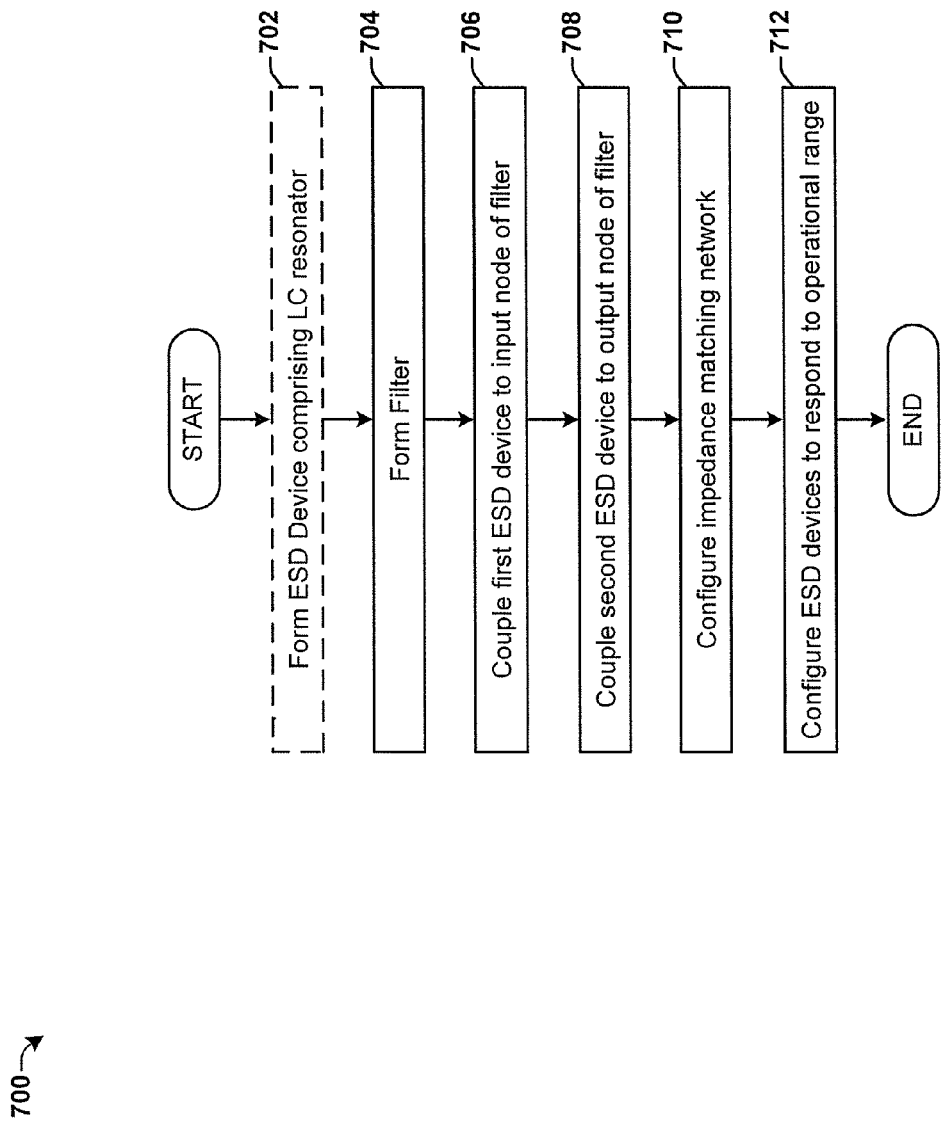

INTEGRATED PASSIVE DEVICE FILTER WITH FULLY ON-CHIP ESD PROTECTION

BACKGROUND

Band pass filters (BPFs) are used extensively in mobile communications systems such as cellular phones and wireless local area networks (WLAN) to suppress unwanted noise and produce signals with enough gain and narrow frequency range to meet desired specifications. Electrostatic discharge (ESD) can damage a BPF and reduce yield. To mitigate against ESD damage, ESD protection diodes are tied to input and output pins of the BPF to redirect charge from an ESD event away from the BPF. Plug-and play ESD diodes may be reused for a variety of circuit applications, but can cost significant die area to meet performance standards. Smaller BPFs may tailored to a given device application, but are a limited range of use.

BRIEF DESCRIPTION OF THE DRAWINGS

FIG. 7 illustrates a flow diagram of some embodiments of a method to form a BPF with fully on-chip ESD LC resonators.

DETAILED DESCRIPTION

Figure 1:
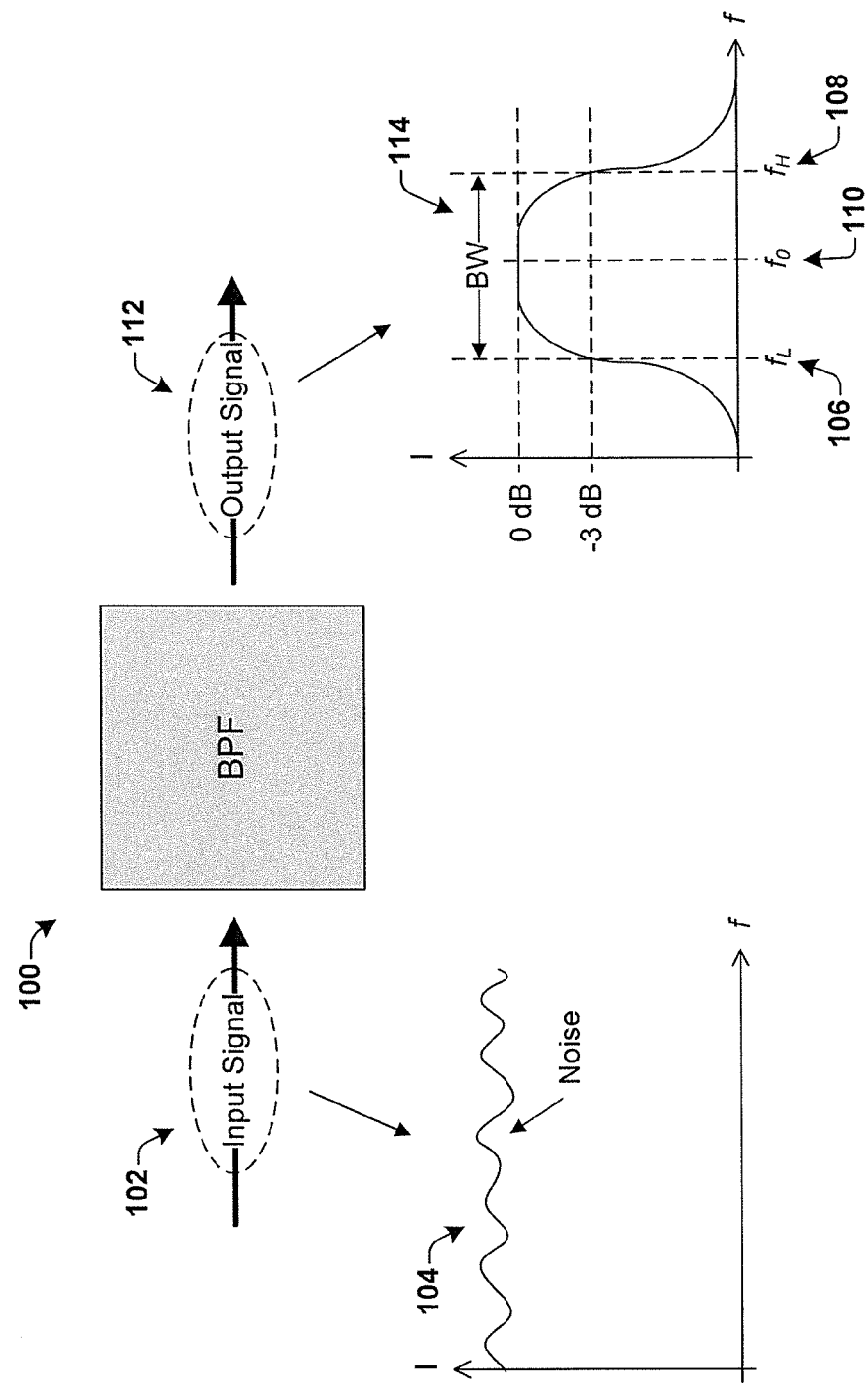
FIG. 1 illustrates the operation of a band pass filter (BPF).

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates the operation of a band pass filter (BPF) 100. An input signal 102 is received which contains wide range of frequency data 104. The input signal 102 may be an analogue signal which contains data for transmission as well as data outside the desired frequency range (e.g., noise). Input frequencies below a lower cut-off frequency, $f_L$ 106, and higher than a higher cut-off frequency, $f_H$ 108, are attenuated by the band pass filter 100. This produces an output signal 112 in a desired frequency range, or bandwidth (BW) 114 (i.e., $BW=f_H-f_L$) which is centered about a center frequency $f_0$ 110 (i.e., the arithmetic mean of $f_L$ and $f_H$), and is a subset of the input frequency range. The bandwidth of BPF 100 may be defined as a range between half-power attenuation for the lower cut-off frequency 106 and the higher cut-off frequency 108 (i.e., a gain −3 dB).

Figure 2:
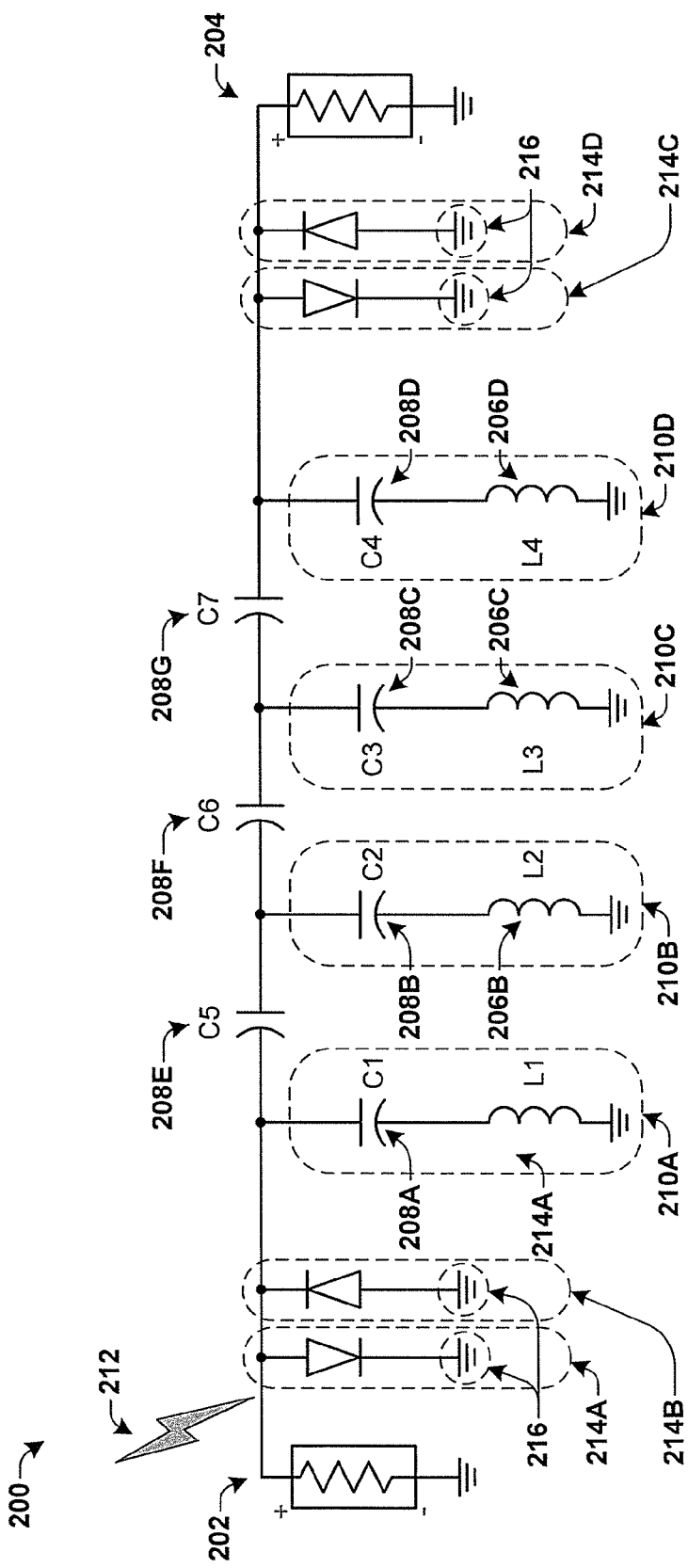
FIG. 2 illustrates some embodiments of a high-performance BPF with ESD protection diodes.

FIG. 2 illustrates some embodiments of a high-performance BPF 200, comprising an LC network formed between an input node 202 and an output node 204. Four LC series components 210A-210D are connected between the input node 202 and the output node 204, wherein a respective LC series component 210A-210D comprises an inductor, 206A-206D respectively, coupled in series with capacitor, 208A-208D respectively. A respective pair of LC series components 210A-210D separated by a respective capacitor 208E-208G (e.g., LC series component 210A and LC series component 210B are connected in series and separated by a capacitor 208E, etc.). Capacitors 208A-208G comprise metal-insulator-metal capacitors (MIMCAPs) formed on a plurality of metallization layers disposed within an electrically-isolating material (e.g., a dielectric) with a thickness of approximately 1 nm to approximately 10 nm.

An electrostatic discharge (ESD) event 212 (e.g., static electricity discharge) interacting with the high-performance BPF 200 can cause damage to one or more capacitors 208A-208G. To mitigate against ESD damage to ESD protection diodes 214A-214D are tied to the input node 202 and the output node 204 of the high-performance BPF 200 to redirect charge from the ESD event 212 to ground 216. ESD protection diodes 214A-214D comprise unidirectional diodes configured in pairs. ESD protection diodes 214A and 214C redirect a positive ESD event, and ESD protection diodes 214B and 214D redirect a negative ESD event.

"Plug-and-play" ESD protection diodes may be reused for a variety of circuit applications, but can cost significant die area to meet performance standards (e.g., insertion loss, impedance mismatch, etc.). Smaller BPFs may tailored to a given device application, but are a limited range of use. Additional techniques for tailoring ESD protection diodes to a specific device application may reduce a number of transmission zeros for a band pass characteristic of the ESD protection diodes, widening bandwidth thus reducing selectivity and performance. Surface-mounted device (SMD) ESD diodes placed during BPF fabrication can degrade yield. Additionally, for 2.5D or 3D integrated circuit (IC) applications ESD protection my require off-chip ESD protection for integrated passive device (IPD) chips as active ESD protection diodes are not available for an IPD process, which comprises only metallization layers disposed in dielectric (i.e., no active gates or other front-end circuitry).

Accordingly, the present disclosure relates to an on-chip ESD protection circuit that may be reused for a variety of integrated circuit applications. An LC parallel resonator is used as an ESD protection circuit and also as a part of an impedance matching network for a given IC application. The ESD LC resonator can be designed with a variety of BPF topologies. On-chip ESD protection circuit allows for co-optimization ESD and BPF performance simultaneously, a fully on-chip ESD solution for IPD processes. On-chip ESD protection also eliminates a need for active ESD device protection, additional processes to support off-chip ESD protection, reduces power consumption, and creates a reusable BPF topology.

Figure 3A:
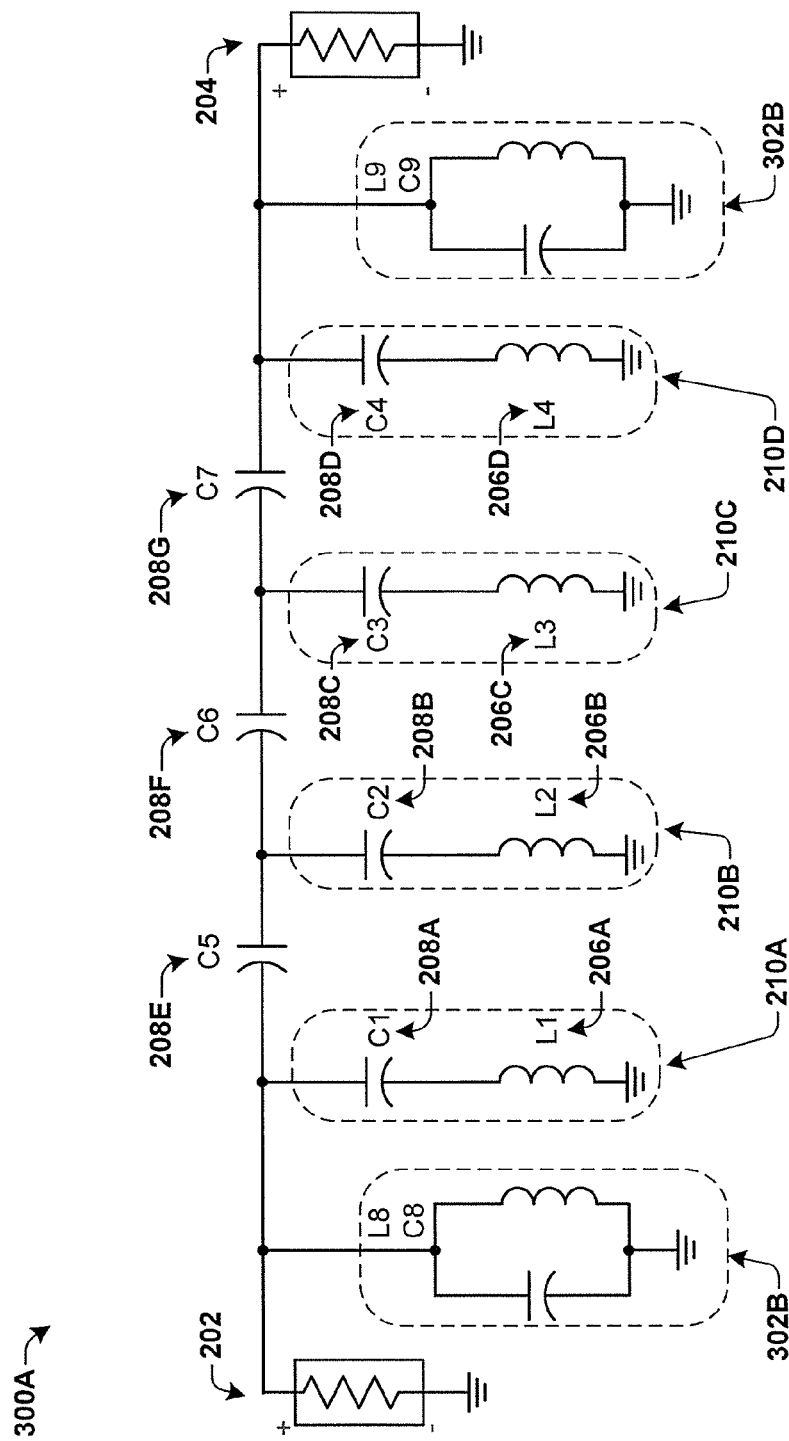
FIG. 3A illustrates some embodiments of a high-performance BPF with ESD LC resonators.

FIG. 3A illustrates some embodiments of a high-performance BPF 300 comprising a first ESD LC resonator 302A coupled to an input node 202 of the high-performance BPF 300, and a second ESD LC resonator 302B coupled to an output node 204. The first ESD LC resonator 302A and the second ESD LC resonator 302B provide ESD protection to the high-performance BPF 300, and provide a purely passive solution to ESD protection with no magnetic or capacitive coupling to the BPF 300.

Figure 3B:
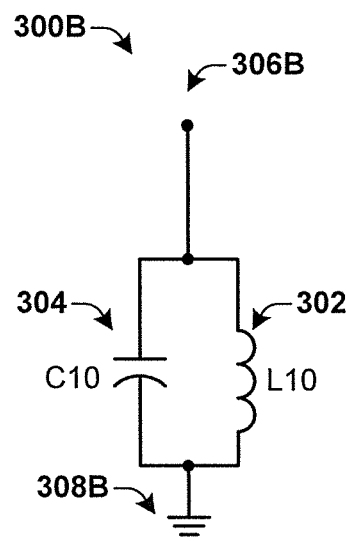
FIG. 3B illustrates some embodiments of an ESD LC resonator.

FIG. 3B illustrates some embodiments of an ESD LC resonator 300B, comprising an inductor 302 and a capacitor 304 configured in parallel between a voltage source 306B and ground 308B. The ESD LC resonator 300B is configured to operate as transparent for signals in a voltage range of normal operation of the filter, comprising voltages less than approximately 10 V, and as a bypass circuit for signals in an elevated voltage range between approximately 2 kV and approximately 15 kV. Moreover, since passive circuitry of the ESD LC resonator 300B comprises an inductor 302, ESD LC resonator 300B may also provide an impedance-matching network for a BPF by matching an impedance of the ESD LC resonator 300B to a node to which the ESD LC resonator 300B connects.

Figure 3C:
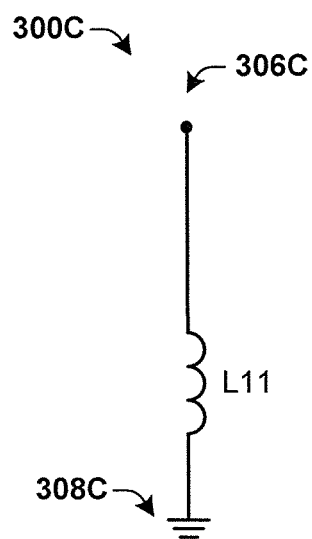
FIG. 3C illustrates some embodiments of an ESD shunt inductor.

In place of the ESD LC resonator 300B, a shunt inductor may be used for ESD protection (i.e., remove the capacitor 304 from the ESD LC resonator 300B). FIG. 3C illustrates some embodiments of an ESD shunt inductor 300C configured between a voltage source 306C and ground 308C. The ESD shunt inductor 300C is configured to operate as transparent for signals in a current range of normal operation of the filter, comprising currents less than approximately 10 A, and as a bypass circuit for signals in an elevated current range greater than approximately 10 A. The ESD shunt inductor 300C may also provide an impedance-matching network for a BPF by matching an impedance of the ESD shunt inductor 300C to a node to which the ESD shunt inductor 300C connects.

Figure 3D:
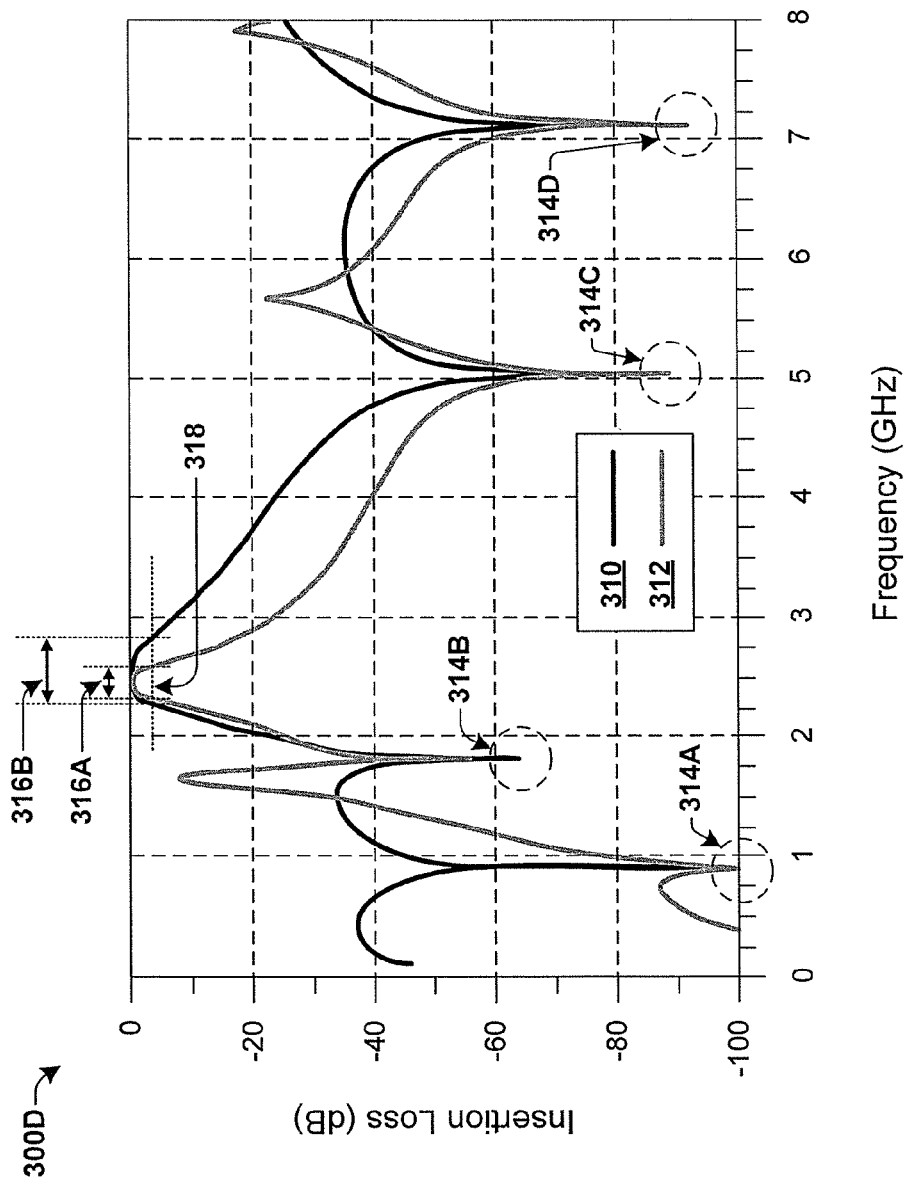
FIG. 3D illustrates some embodiments of insertion loss characteristics for a high-performance BPF without ESD LC resonators and with ESD LC resonators.

FIG. 3D illustrates some embodiments of insertion loss (IL) characteristics 300D, comprising an IL characteristic for a high-performance BPF without ESD LC resonators 310 and an IL characteristic for a high-performance BPF with ESD LC resonators 312. IL defines the amount of signal transmitted by a filter to the amount received $$IL(dB) = -10 log_{10}\left(\frac{Power_{transmitted}}{Power_{incident}}\right),$$

such that an input signal that is totally transmitted has an insertion loss of 0 dB. An IL characteristic for the high-performance BPF with ESD LC resonators 312 demonstrates better frequency selectivity (i.e., bandwidth) 316A of approximately 250 MHz than a frequency selectivity 316B of approximately 500 MHz for the high-performance BPF without ESD LC resonators 310. The IL characteristic with ESD LC resonators 312 also maintains 4 transmission zeros 314A-314D to maintain high-performance for selectivity 316A in a range of approximately 2 GHz to approximately 5 GHz, with a peak bandwidth 318 centered at approximately 2.4 GHz, a range of mobile communication systems. Although FIG. 3C is not meant to be representative of all BPF parametrics for all BPFs in any way, it does tend to show that the proposed implementations can provide significant performance compared to some prior art approaches.

Figure 4:
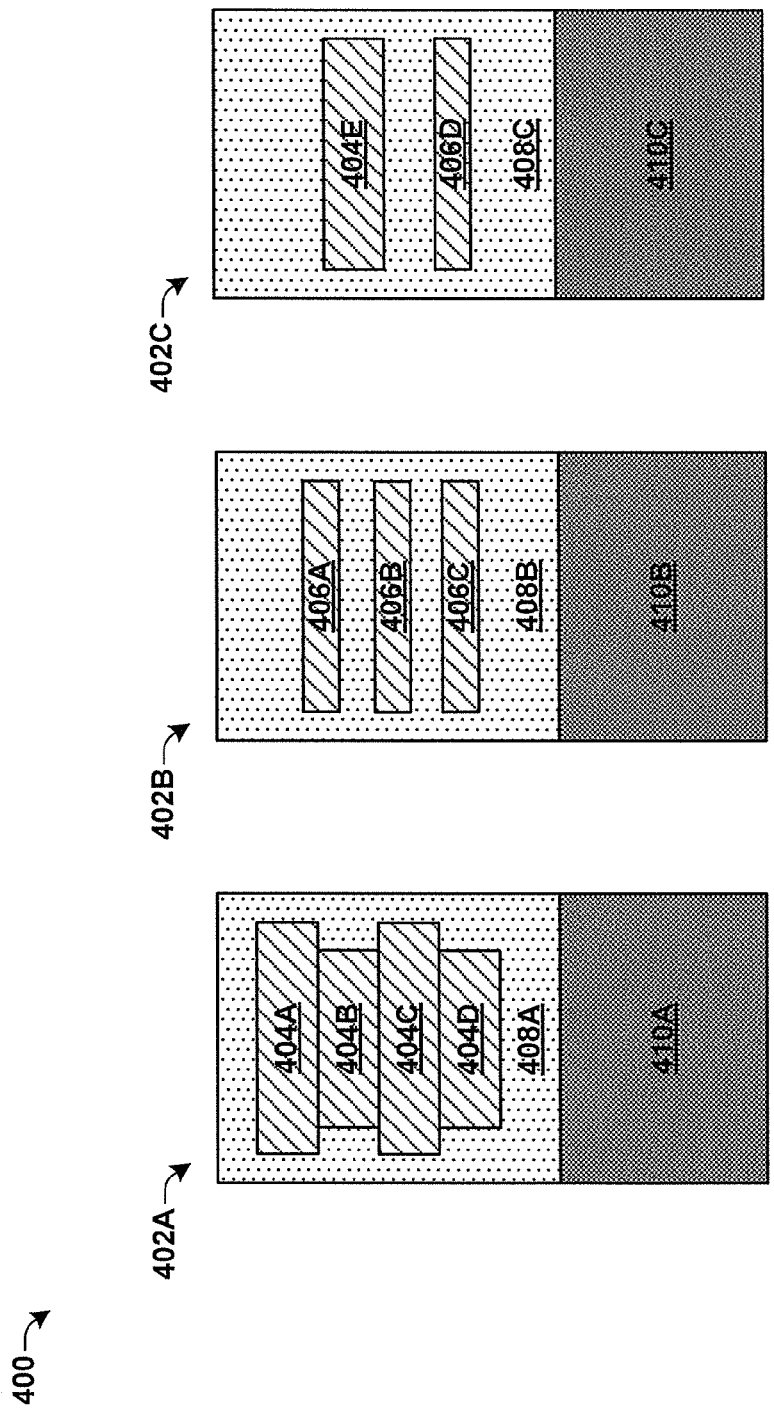
FIG. 4 illustrates some embodiments of 2.5D or 3D IC applications for ESD LC resonators.

FIG. 4 illustrates some embodiments of 2.5D or 3D IC applications 400 for ESD LC resonators. The inductor 302 of the ESD LC resonator 300B is formed on metallization layers comprising aluminum metallization layers 406A-406D with a thickness of approximately 0.9 um, or copper metallization layers 404A-404E with a thickness of approximately 3.0 um. The inductor 302 comprises a spiral pattern comprising N turns formed one or more of the metallization layers 404A-404E or 406A-406D. The capacitor comprises a MIMCAP formed on a plurality of metallization layers disposed within an electrically-isolating material (e.g., a dielectric) with a thickness of approximately 1 nm to approximately 10 nm.

Application 402A comprises an integrated passive device (IPD) chip 408A with an inductor comprising four copper metallization layers 404A-404D with a thickness of approximately 0.9 um, wherein aluminum metallization layers 404B and 404D comprise vias which form connections to copper metallization layers 404A and 404C, comprising a spiral pattern. The inductor is coupled to a hi-resistance silicon substrate 410A with a resistivity of 5,000 ohm-cm. Application 402B comprises an interposer 408B comprising three aluminum metallization layers 406A-406C comprising spiral patterns with a thickness of approximately 3.0 um which is coupled to a second silicon substrate 410B. A plurality of vias (not shown) form connection between aluminum metallization layers 406A-406C. Application 402C comprises a complementary metal-oxide semiconductor (CMOS) chip 408C comprising a copper metallization layer 404E with a thickness of approximately 3.0 um positioned above an aluminum metallization layer 406D with a thickness of approximately 0.9 um which is coupled to a silicon substrate 410C. Copper metallization layer 404E and aluminum metallization layer 406D comprise spiral patterns connected by a plurality of vias (not shown). Applications 402A-402C comprise on-chip ESD LC resonators.

Figure 5:
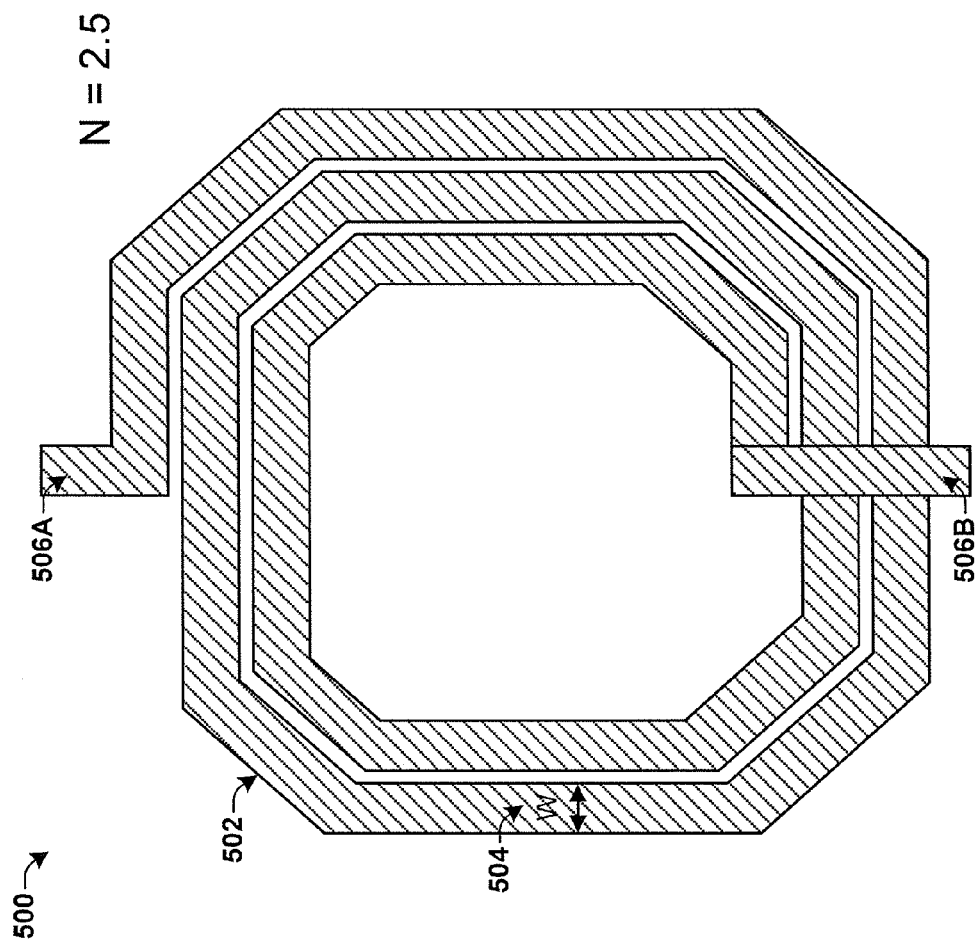
FIG. 5 illustrates some embodiments of an inductor for use in an ESD LC resonator.

FIG. 5 illustrates some embodiments of an inductor 500 for use in an ESD LC resonator or ESD shunt inductor. To optimize ESD performance, the following features are recommended for the inductor 500: A spiral pattern comprising N=2.5 turns formed on one or more metallization layers 502 (e.g., copper or aluminum) with a metallization width 504 between approximately 2 um and approximately 20 um and a metallization thickness between approximately 0.9 um (e.g., aluminum) and 3.0 um (e.g., aluminum). For an inductor 500 comprising a spiral pattern on a plurality of metallization layers 502, intra metal connections are formed with between approximately 50 vias and approximately 400 vias configured in parallel. The spiral pattern conducts current two directions between a first node 506A and a second node 506B.

An electrical response of the inductor 500 is determined by the features described above. Metallization layer 502 supports current densities of approximately 0.5 Num. ESD voltages range between approximately 2 kV and approximately 15 kV with a metallization resistance of 1.5 kΩ. Therefore, for a 2 kV ESD event an ESD current of 1.33 A is produced, resulting in a minimum width of approximately 2.7 um to maintain a current density of approximately 0.5 Num. Similarly, for a 15 kV ESD event an ESD current of 10 A is produced resulting in a maximum width of approximately 20 um to maintain a current density of approximately 0.5 A/um.

Figure 6:
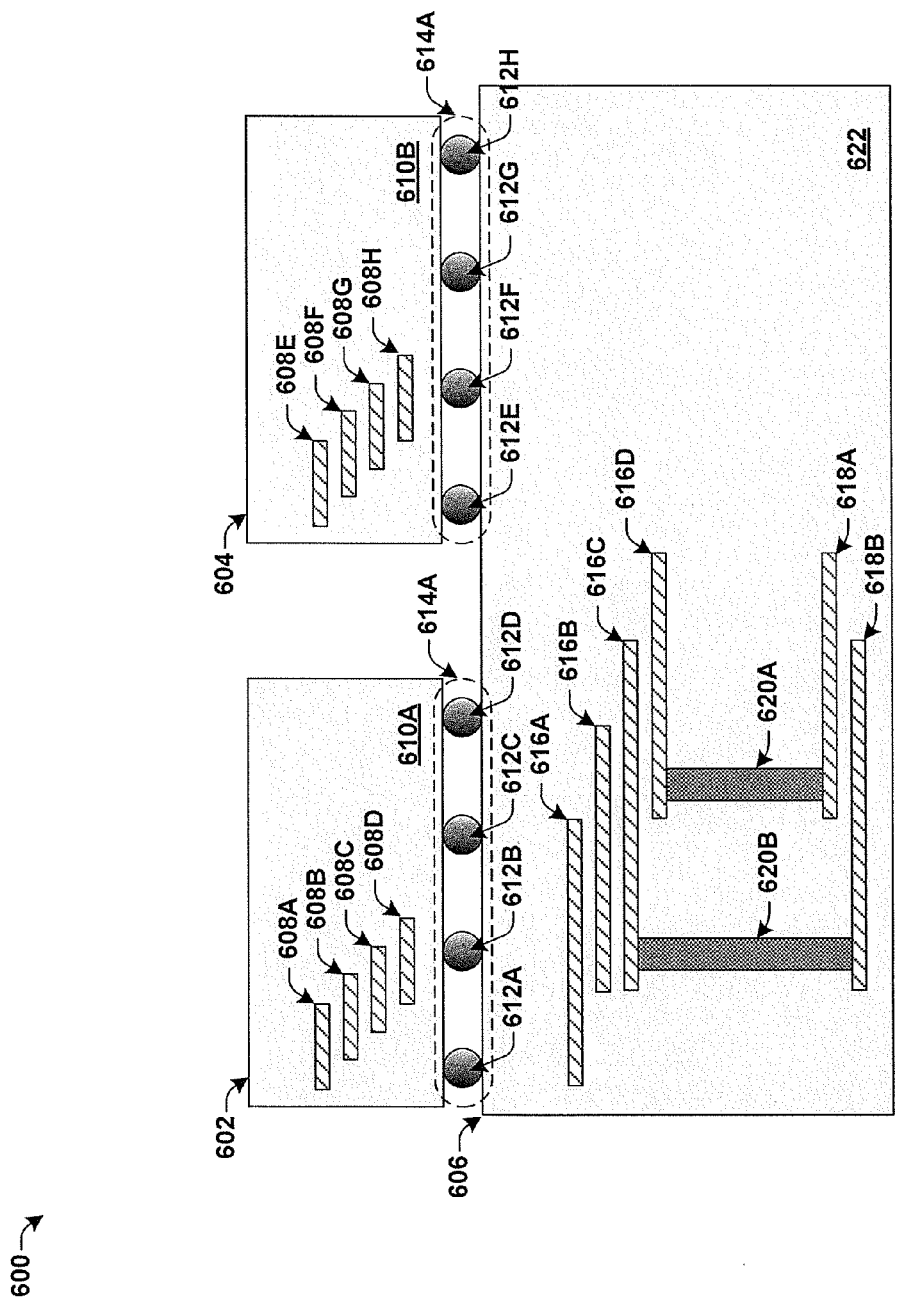
FIG. 6 illustrates some embodiments of 2.5D or 3D IC applications for a BPF with ESD LC resonators.

FIG. 6 illustrates some embodiments of 2.5D or 3D IC applications 600 for a BPF with ESD LC resonators. An IPD chip 602 comprising metallization layers 608A-608D (e.g., copper or aluminum) disposed within a first electrically-isolating material 610A (e.g., a dielectric) is formed above an interposer 606 and coupled to the interposer 606 by a first plurality of solder balls 612A-612D comprising a first ball grid array 614A. A CMOS chip 604 comprising metallization layers 608E-608H disposed within a second electrically-isolating material 610B is formed above the interposer 606 and coupled to the interposer 606 by a second plurality of solder balls 612E-612H comprising a first ball grid array 614B. The interposer comprises a plurality of front-side metallization layers 616A-616D, a plurality of back-side metallization layers 618A-618B coupled through thru silicon vias (TSVs)

620A-620B, and disposed within an insulating layer or a molding compound (e.g., epoxy) 622. For off-chip ESD LC resonator protection of a BPF, the BPF is formed within a first chip and a the ESD LC resonator is formed within a second chip, the first chip and the second chip comprise any combination of the IPD chip 602, the CMOS chip 604, and the interposer 606. For on-chip ESD LC resonator protection of a BPF, the BPF and ESD LC resonator are formed within a same chip comprising the IPD chip 602, the CMOS chip 604, or the interposer 606

FIG. 7 illustrates a flow diagram of some embodiments of a method 700 to form a BPF with fully on-chip ESD LC resonators. While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702 a plurality of ESD protection devices for reuse in various applications are formed. A respective ESD device comprises an ESD LC resonator comprising an inductor and a capacitor configured in parallel between an input and ground.

At 704 a plurality of passive circuit components are arranged to form a filter with an input node and an output node on an IPD chip, a CMOS chip, or an interposer. The plurality of passive circuit components comprise an LC network.

At 706 a first ESD protection device is coupled to the input node of the filter, wherein the input node serves as the input of the first ESD protection device.

At 708 a second ESD protection device is coupled to the output node, wherein the output node serves as the input of the second ESD protection device.

At 710 the first ESD protection device, the second ESD protection device, and the plurality of passive circuit components are configured to act as an impedance matching network in an operation range of the filter.

At 712 the first ESD protection device and the second ESD protection device are configured to operate as transparent devices for signals in the operational range of the filter and as bypass circuits for signals in outside the operation range of the filter.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a to an on-chip ESD protection circuit that may be reused for a variety of integrated circuit applications. An LC parallel resonator is used as an ESD protection circuit and also as a part of an impedance matching network for a given IC application. The ESD LC resonator can be designed with a variety of BPF topologies. On-chip ESD protection circuit allows for co-optimization ESD and BPF performance simultaneously, a fully on-chip ESD solution for IPD processes. On-chip ESD protection also eliminates a need for active ESD device protection, additional processes to support off-chip ESD protection, reduces power consumption, and creates a reusable BPF topology.

In some embodiments the present disclosure relates to an ESD protection circuit, comprising an inductor and a capacitor configured in parallel between a voltage source and ground. The ESD protection circuit is coupled to an input node or an output node of a circuit, and configured to operate as transparent for signals in a voltage range of normal operation of the circuit and as a bypass circuit for signals in an elevated voltage range.

In some embodiments the present disclosure relates to a filter configured for ESD protection, comprising an input node configured to receive an input signal in a first frequency range, and an output node configured to transmit an output signal in a second frequency range which is a subset of the first frequency range. One or more ESD LC resonators is coupled to the input node, the output node, or both, wherein a respective ESD LC resonator comprising an inductor and a capacitor configured in parallel between either the input node and ground or the output node and ground. A respective ESD LC resonator is configured to operate as transparent for signals in a voltage range of normal operation of the filter and as a bypass circuit for signals in an elevated voltage range.

In some embodiments the present disclosure relates to a method of forming a filter with fully on-chip ESD protection. A plurality of ESD protection devices are formed for reuse in various applications, wherein a respective ESD device comprises an ESD LC resonator comprising an inductor and a capacitor configured in parallel between an input and ground. A plurality of passive circuit components are arranged to form a filter with an input node and an output node on an integrated passive device chip. A first ESD protection device is coupled to the input node, and a second ESD protection device is coupled to the output node. The first ESD protection device, the second ESD protection device, and the plurality of passive circuit components are configured to act as an impedance matching network in an operation range of the filter.

What is claimed is:

1. A filter, comprising:
   a conductive path coupling an input node of the filter to an output node of the filter;
   a first electrostatic discharge (ESD) protection circuit coupled to the conductive path and comprising a first inductor and a first capacitor, wherein the first inductor and the first capacitor are configured in parallel between the input node and ground; and
   two or more inductor-capacitor (LC) series components coupled to the conductive path and connected between the conductive path and the ground, wherein the two or more LC series components respectively comprise an inductor coupled in series with a capacitor, and wherein the two or more LC series components are coupled to the conductive path at two or more additional nodes, respectively, without an inductor arranged along the conductive path between a neighboring pair of the two or more additional nodes.

2. The filter of claim 1, wherein:
the first inductor further comprises a spiral pattern comprising N=2.5 turns formed on one or more metallization layers with a width between approximately 2 micrometers (um) and approximately 20 um;
the first capacitor further comprises a metal-insulator-metal capacitor formed on the one or more metallization layers;
the first ESD protection circuit is formed within a complementary metal-oxide semiconductor die; and
the one or more metallization layers comprise a copper metallization layer with a first thickness of approximately 3.0 um positioned over an aluminum metallization layer with a second thickness of approximately 0.9 um.

3. The filter of claim 1, further comprising a second ESD protection circuit coupled to the conductive path and comprising a second inductor and a second capacitor, wherein the second inductor and the second capacitor are configured between the output node and the ground.

4. The filter of claim 1, further comprising:
a third capacitor located on the conductive path;
wherein the two or more LC series components comprise a first LC series component connected to a first terminal of the third capacitor and a second LC series component connected to a second terminal of the third capacitor; and
wherein no inductor is located on the conductive path between the two or more LC series components.

5. The filter of claim 1, wherein the two or more LC series components comprise an even number of LC series components that are symmetrically distributed on the conductive path.

6. A filter configured for ESD protection, comprising:
an input node configured to receive an input signal in a first frequency range;
an output node configured to transmit an output signal in a second frequency range which is a subset of the first frequency range;
a conductive path connecting the input and output nodes, wherein no inductor is located along the conductive path;
a first electrostatic discharge (ESD) protection circuit connected to a first node located on the conductive path, wherein the first ESD protection circuit comprises a first inductor and a first capacitor configured in parallel between the first node and ground;
a second ESD protection circuit connected to a second node located on the conductive path, wherein the second ESD protection circuit comprises a second inductor and a second capacitor configured in parallel between the second node and the ground; and
two or more inductor-capacitor (LC) series components connected to two or more intermediate nodes, respectively, that are located on the conductive path intermediate the first and second nodes, wherein the two or more LC series components respectively comprise an inductor coupled in series with a capacitor between a respective intermediate node and the ground.

7. The filter of claim 6, wherein the one or more LC series components and the first or second ESD protection circuit are formed within a chip comprising an interposer or are formed within a die that contains no active circuitry.

8. The filter of claim 6:
wherein the one or more LC series components are formed within a first die and the first and second ESD protection circuits are formed within a second die;
wherein the first die and the second die are coupled to an interposer through a plurality of solder balls comprising a ball grid array; and
wherein the first die or the second die contain no active circuitry.

9. The filter according to claim 8, wherein the first die and the second die are coupled to a common side of the interposer.

10. The filter according to claim 8, wherein the interposer includes:
first metallization layers arranged on a first side of the interposer, proximate to the first and second dies;
second metallization layers arranged on a second side of the interposer, distal from the first and second dies and opposite the first side; and
through silicon vias (TSVs) to electrically coupling the first metallization layers to the second metallization layers.

11. The filter of claim 6, further comprising:
a third capacitor located on the conductive path;
wherein the two or more LC series components comprise a first LC series component connected to a first terminal of the third capacitor and a second LC series component connected to a second terminal of the third capacitor.

12. The filter of claim 6:
wherein the first or second ESD protection circuit is formed within a first die containing no active circuitry; and
wherein the one or more LC series components are formed within a second die that does not contain active circuitry, or are formed within an interposer.

13. The filter of claim 6, wherein the first node is arranged between the input node and the two or more LC series components, and wherein the second node is arranged between the two or more LC series components and the output node.

14. A method of forming a filter:
connecting a first electrostatic discharge (ESD) protection circuit to an input node, wherein the first ESD protection circuit comprises a first inductor and a first capacitor configured in parallel between the input node and ground;
connecting two or more inductor-capacitor (LC) series components to two or more intermediate nodes, respectively, that are located between the input node and the ground, wherein the two or more LC series components respectively comprise an inductor coupled in series with a capacitor between a respective intermediate node and the ground;
connecting a second ESD protection circuit to an output node that is coupled to the input node by a conductive path extending through the two or more intermediate nodes, wherein the second ESD protection circuit comprises a second inductor and a second capacitor configured in parallel between the output node and the ground; and
forming the conductive path without an inductor.

15. The method of claim 14, further comprising connecting adjacent pairs of the two or more LC series components to each other though a capacitor, such that a first LC series component of the adjacent pair is connected to a first terminal of the capacitor and a second LC series component of the adjacent pair is connected to a second terminal of the capacitor.

16. The method according to claim 14, further including:
forming the conductive path with an inductance of about zero between a neighboring pair of the two or more intermediate nodes.

* * * * *